United States Patent [19]

Konno

[11] Patent Number: 5,266,113
[45] Date of Patent: Nov. 30, 1993

[54] DISPENSER FOR APPLYING SOLDER

[75] Inventor: Masahiko Konno, Saitama, Japan

[73] Assignee: Pioneer Electronic Corporation, Tokyo, Japan

[21] Appl. No.: 826,502

[22] Filed: Jan. 27, 1992

[30] Foreign Application Priority Data

Jun. 6, 1991 [JP] Japan ................ 3-162022

[51] Int. Cl.⁵ .................... B05C 1/00; B05C 21/00
[52] U.S. Cl. ........................ 118/74; 118/100; 118/258; 118/413; 118/414; 228/35; 228/52
[58] Field of Search ............. 118/410, 413, 73, 72, 118/74, 415, 414, 100, 110, 244, 258, 259; 228/35, 52, 53, 256

[56] References Cited

U.S. PATENT DOCUMENTS

| | | | |
|---|---|---|---|
| 529,336 | 11/1894 | Monroe | 228/35 |
| 1,561,015 | 11/1925 | Painter | 228/35 |
| 2,791,669 | 5/1957 | Ferrara | 228/35 |
| 3,876,857 | 4/1975 | Dhillon | 228/53 |
| 4,622,239 | 11/1986 | Schoenthaler et al. | 118/410 |
| 4,805,830 | 2/1989 | Kawaguchi | 228/53 |
| 4,876,982 | 10/1989 | Claasen | 118/413 |
| 4,898,117 | 2/1990 | Ledermann et al. | 118/413 |
| 4,934,309 | 6/1990 | Ledermann et al. | 118/410 |
| 4,961,955 | 10/1990 | Goldberg | 118/410 |
| 5,042,708 | 8/1991 | Ledermann et al. | 228/53 |

FOREIGN PATENT DOCUMENTS

| | | | |
|---|---|---|---|
| 52-62153 | 5/1977 | Japan | 228/53 |
| 2-217163 | 8/1990 | Japan | 228/256 |
| 2095290 | 9/1982 | United Kingdom | 228/256 |

*Primary Examiner*—W. Gary Jones
*Assistant Examiner*—Steven P. Griffin
*Attorney, Agent, or Firm*—Nikaido, Marmelstein, Murray & Oram

[57] ABSTRACT

A dispenser has a tube and a tip portion having a flat passage communicated with the tube and an elongated opening at a lower end thereof. The flat passage has a constant sectional area over the entire axial length thereof, so that the solder flows in the passage at a constant rate.

2 Claims, 4 Drawing Sheets

DISPENSER FOR APPLYING SOLDER

BACKGROUND OF THE INVENTION

The present invention relates to a dispenser for applying cream-like solder on a substrate of a semiconductor device so as to solder terminals of an electronic element to a wiring pattern of the substrate.

In order to mount an electronic element such as an integrated circuit (IC) chip on a substrate of the semiconductor device, the terminals of the electronic element are soldered on the wiring pattern formed on the substrate. When a compact electronic element having a plurality of terminals is mounted on a small substrate at a high density, a cream-like solder having a low fluidity is used.

FIG. 5 describes a method for applying cream-like solder 40 which contains flux of 10% to 15%. The solder is applied on a plurality of lands 21 of a wiring pattern formed on a substrate 10 of a semiconductor device. The solder 40 is continuously applied on the lands 21 through a dispenser 30 having a cylindrical needle tube 31 with an opening 32 at the end thereof. Thus, a long strip of solder 40 is formed over the lands 21 as shown in FIG. 6. Thereafter, as shown in FIG. 7, terminals 51 and 52 of an electronic element 50 is mounted on the lands 21. When heated, the solder 40 is melted, thereby forming a meniscus of the solder because of surface tension thereof. As a result, the solder 40 is divided into individual blocks 41 and 42 on each land, so that each of the lands 21 are insulated from one another.

However, since the solder 40 is dispensed through the circular opening 32, a large quantity of solder 40 is apt to be accumulated on the land to form a spherical strip having a large height H as shown in FIG. 6. The terminals 51 and 52 are accordingly buried in the blocks 41 and 42 as shown in FIG. 7, so that the solder 40 may spread out of the lands 21. consequently, bridges which cause a short-circuit between the lands 21 are formed.

Moreover, the strip of solder 40 shown in FIG. 6 is not sufficiently spread to cover the entire surface area of each land. Namely, the width W of the strip is far smaller than the length L of the lands 21, so that a large bare area is formed on the land. Since the bare surface is not cleansed by the flux included in the solder, an oxide film remains on the land. As a result, the land 21 has poor wettability so that juncture area between the terminal of the electronic element and the land is small, resulting in decrease of the juncture strength and increase of the electrical resistance therebetween.

Furthermore, the juncture strength of the solder decreases as the quantity of solder on the juncture area increases. Since the solder 40 is accumulated to form a mound as shown in FIG. 7, the quantity of the solder at the juncture area is large. Thus, the juncture strength of the portions 41 and 42 tends to be further decreased.

SUMMARY OF THE INVENTION

An object of the present invention is to provide a dispenser for applying solder where the solder, or molten solder is sufficiently spread on lands of a wiring pattern formed on a substrate of a semiconductor device, so that an electronic element can be securely mounted on the lands with a low electric resistance.

In accordance with the present invention, there is provided a dispenser for applying cream-like solder on a wiring pattern formed on a substrate of a semiconductor device. The dispenser comprises a tube and a tip portion having a flat passage communicated with the tube and an elongated opening at a lower end thereof. The flat passage has a constant sectional area over the entire axial length thereof, so that the solder flows in the passage at a constant rate.

In an aspect of the present invention, means for leveling the solder applied on the wiring pattern is mounted on a tip end portion of the dispenser.

In another aspect of the present invention, a flux dispenser having a tube and a brush mounted on the tube is mounted on the dispenser for the solder so as to apply flux on the pattern prior to the application of the solder.

When the solder is applied on the pattern of the substrate from the dispenser of the present invention, a strip of solder layer having a small thickness is formed. In order to solder terminals of an electronic element on the pattern, the solder is heated and melted, so that the molten solder is sufficiently spread. Thus, the terminals are soldered on the substrate with an excellent mechanical strength and a small electrical resistance.

The other objects and features of this invention will become understood from the following description with reference to the accompanying drawings.

DETAILED DESCRIPTION OF THE PREFERRED EMBODIMENTS

Figure 5:
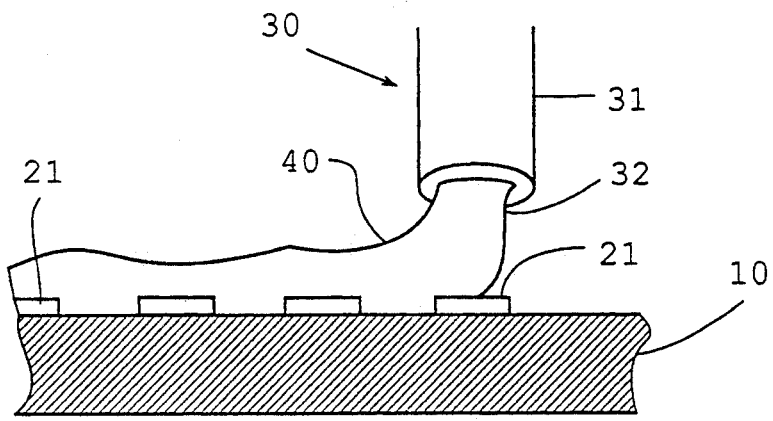
FIG. 5 is a side view showing a conventional dispenser for applying solder.

The first embodiment of the present invention is described hereinafter with reference to FIGS. 1a, 1b and 2. The same references as those in FIGS. 5 to 7 designate the same parts in the figures.

Figure 1A:
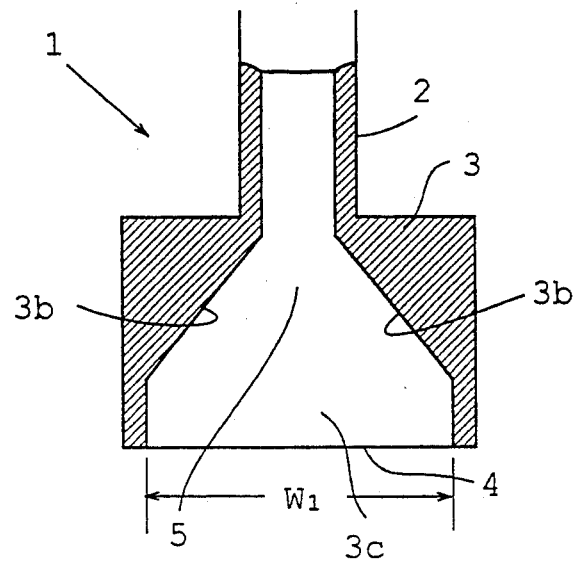
FIGS. 1a and 1b show a sectional view and a perspective view of a dispenser in accordance with the present invention.
Figure 1B:
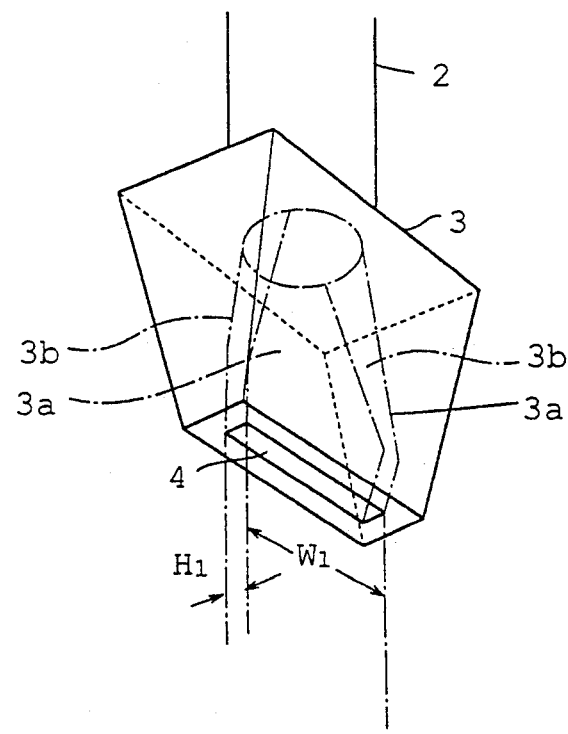

Referring to FIGS. 1a and 1b, a dispenser 1 according to the present invention has a tube 2 which is communicated with a supply of solder. The tube 2 is connected to a tip portion 3 having a flat passage 5 defined by a pair of trapezoidal walls 3a and a pair of inverted-trapezoidal walls 3b. The flat passage 5 has a hopper-like shape and is formed such that the passage has a constant sectional area across the entire axial length of the passage by reducing the thickness thereof. The passage 5 is communicated with an elongated opening 4 through a straight passage 3c. Thus, the solder passing through the tube 2 in a cylindrical flow is changed into a planar flow in the passage 5 and flows therein at the same rate as in the tube 2. The length $W_1$ of the opening 4 is equal to or slightly smaller than the length L of the land 21 (FIG. 2).

Figure 2:
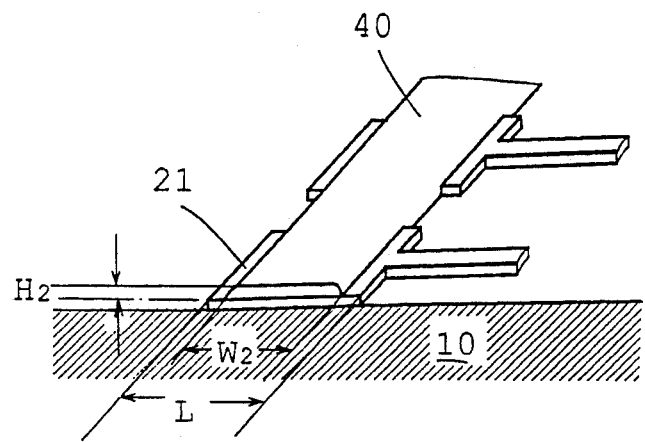
FIG. 2 is a perspective view of a substrate of a semiconductor on which the solder is applied.

As shown in FIG. 2, the solder 40 in which the flux is included in the quantity of 10% to 15%, is applied on the lands 21 by the dispenser 1. The solder 40 is sufficiently spread in the longitudinal direction of the lands 21 to form a flat strip.

Figure 6:
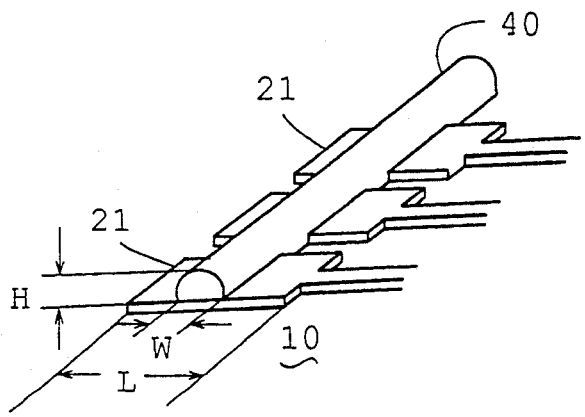
FIG. 6 is a perspective view showing the substrate applied with the solder by the dispenser of FIG. 5.
Figure 7:
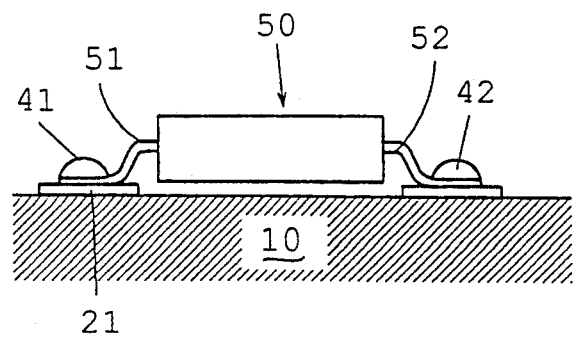
FIG. 7 is a side view of an electronic element mounted on the substrate.

For example, when the solder 40 was applied through the dispenser 1 having the length $W_1$ of 1.5 mm and width $H_1$ of 0.2 mm, the solder 40 covering the land having the length L of 1.7 mm had a length $W_2$ (width of the solder strip) of 1.4 mm and a height $H_2$ of 0.21 mm. The ratio $W_2/L$ is 0.82 in the present invention, whereas the ratio W/L is about 0.2. The ratio of the height $H_2$ of the strip according to the present invention to the height H of the strip of FIG. 6 is 0.36. Hence the height $H_2$ is small enough.

Thereafter, terminals of an electronic element is mounted on the lands as described hereinbefore. The solder 40 is heated so as to be liquified. As a result, the solder strip is separated at each land 21. Since the height of the solder 40 is small, the terminals are not buried therein. In addition, since substantially the entire surface of the land is applied with the flux in the solder 40, the surface of the land is cleansed. Hence the wettability of the lands with respect to the molten solder is improved. Namely, the surface of the land, to which the terminal is mounted, is increased. Since the molten solder is sufficiently spread, the formation of bridges of solder between the adjacent lands can be restrained.

Figure 3A:
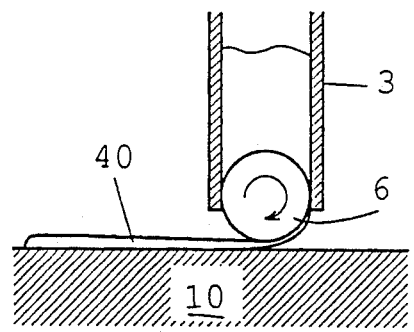
FIGS. 3a and 3b are sectional views showing parts of second and third embodiments of the present invention.

Referring to FIG. 3a, in the second embodiment of the present invention, a cylindrical roller 6 is rotatably mounted in the elongated opening 4 of the tip portion 3. The solder 40 discharged from the opening 4 is leveled by the roller 6 to form a thin layer of the solder having an even thickness. Thus the entire surface of the land 21 can be sufficiently covered with the solder.

Figure 3B:
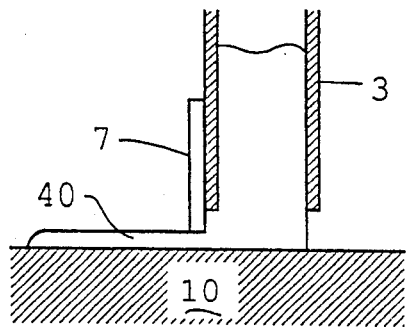

In the third embodiment shown in FIG. 3b, a doctor knife 7 is mounted on the rear wall with respect to the traveling direction of the dispenser 1, such that the bottom edge of the knife 7 is adjusted to render the distance between the edge and the substrate 10 to correspond to the desired height $H_2$ of the solder strip. Thus the solder 40 from the dispenser is extensively spread out to form a strip of uniform thickness.

The cream-like solder 40 cannot contain more than 15% of flux. However, such quantity of flux is not always sufficient to clean the surface of the land 21. Therefore, it is preferable to apply the flux prior to applying the solder so as to improve the wettability of the land.

Figure 4:
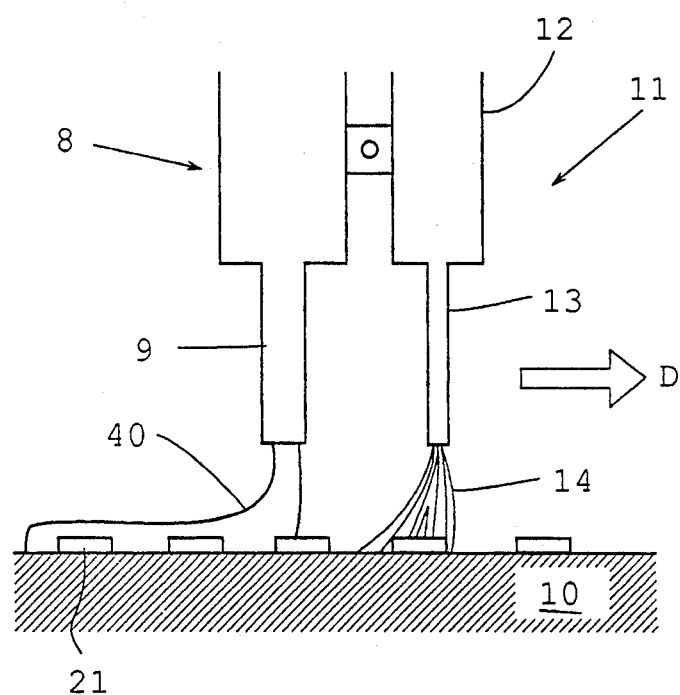
FIG. 4 is a schematic side view of a fourth embodiment of the present invention in operation.

FIG. 4 shows an example of a dispenser satisfying the described requirement. A dispenser 8 has a tube 9 through which the solder 40 is fed. A flux dispenser 11 is mounted on the dispenser 8 at a front portion thereof with respect to the traveling direction D of the dispenser. The flux dispenser 11 comprises a flux tank 12 which is attached to the dispenser 8 and a tube 13. A brush 14 which is capable of brushing the entire length L of the land 21 is provided on the tube 13.

The flux from the tank 12 is supplied through the tube 13 to the brush 14 which spreads the flux on the land. Thereafter, the solder 40 is applied by the dispenser 8. Hence, when the lands 21 are heated at soldering, the surface of each land is cleansed by the flux, thereby improving the wettability of the lands. As a result, the solder 40 is spread over the entire surface of each land 21, so that a layer of solder having a large surface area and a small thickness is provided. Hence, terminals of electronic element are securely soldered on the lands. Moreover, the electric resistance between the lands and the terminals are decreased.

From the foregoing, it will be understood that the present invention provides a dispenser for applying cream-like solder on a substrate of a semiconductor device where the entire surface area of land of a wiring pattern formed on the substrate is applied with the solder so that the juncture strength of the solder is improved. Since the solder is applied in a thin layer, the resistance between the land and the electronic element is decreased and formation of a bridge connecting the adjacent lands can be prevented.

While the presently preferred embodiments of the present invention have been shown and described, it is to be understood that these disclosures are for the purpose of illustration and that various changes and modifications may be made without departing from the scope of the invention as set forth in the appended claims.

What is claimed is:

1. A dispenser for applying solder on a wiring pattern of a substrate, said dispenser comprising:
    a tube for supplying the solder;
    a tip portion having a first end and a second end, said first end connected to the tube, said tip portion having a passage through an axial length thereof from said first end to said second end, said passage communicated with the tube, said tip portion having an elongated rectangular opening at the second end thereof, said elongated rectangular opening having a length which exceeds a width thereof; and
    leveling means mounted on said second end of said tip portion for leveling the solder applied on the wiring pattern, said leveling means comprising a roller provided in the elongated rectangular opening;
    wherein the passage has a constant sectional area over an entire axial length thereof.

2. A dispenser according to claim 1 further comprising a flux dispenser having a brush means coupled thereto for applying flux on the wiring pattern prior to the application of the solder.

* * * * *